United States Patent [19]

Jurisson

[11] 4,394,571
[45] Jul. 19, 1983

[54] OPTICALLY ENHANCED SCHOTTKY BARRIER IR DETECTOR

[75] Inventor: Jaan Jurisson, Fridley, Minn.

[73] Assignee: Honeywell Inc., Minneapolis, Minn.

[21] Appl. No.: 263,966

[22] Filed: May 18, 1981

[51] Int. Cl.³ .......................................... H01J 40/14
[52] U.S. Cl. ................................. 250/216; 357/15; 350/163; 29/569 R
[58] Field of Search ............... 250/211 J, 216; 357/15; 350/163; 29/569 R

[56] References Cited

U.S. PATENT DOCUMENTS 3,902,066  8/1975  Roosild et al.

OTHER PUBLICATIONS

Fundamentals of Optics, Jenkins and White, pp. 175-180, McGraw-Hill Book Company, Inc.-1957.
Progress in Optics, vol. 1, Wolf, pp. 175-180, North-Holland Publishing Company-Amsterdam-1961.
Encyclopedia of Physics, Flugge, pp. 493-496, Springer-Verlag Berlin Gottingen Heidelberg-1956.

Primary Examiner—David C. Nelms
Assistant Examiner—Darwin R. Hostetter
Attorney, Agent, or Firm—Charles J. Ungemach

[57] ABSTRACT

A Schottky barrier type radiation detector in combination with a mirror positioned from the barrier by a distance longitudinally equal to one quarter wavelength of the radiation being detected.

4 Claims, 1 Drawing Figure

OPTICALLY ENHANCED SCHOTTKY BARRIER IR DETECTOR

BACKGROUND OF THE INVENTION

In the field of infrared radiation detection, a type of detector referred to as a Schottky barrier or Schottky diode detector is known. An infrared array utilizing such detectors is described in U.S. Pat. No. 3,902,066 issued to Sven A. Roosild et al, Aug. 26, 1975. Schottky barrier detectors may comprise a base material that is transparent to infrared radiation, such as silicon, with a layer of material such as platinum, osmium or iridium vacuum deposited thereon to a thickness of, perhaps, 100 angstroms and then heated so that the silicon and the platinum diffuse into a boundary layer, which in the case of platinum, is platinum silicide. The layer will be, perhaps, 200 angstroms in thickness. Infrared radiation passing through the silicon base and through the platinum silicide layer is partly absorbed by the platinum silicide and produces a measurable current in a circuit including the base and the barrier. The magnitude of the current depends upon the amount of absorption of the radiation passing through the barrier. In the prior art, the amount of absorption of such radiation has been relatively small and accordingly the current output has not been as large as desired for good infrared radiation detection.

SUMMARY OF THE INVENTION

The purpose of the present invention is to enhance the amount of absorption of radiation in the barrier of a Schottky diode for purposes of increasing the sensitivity to the radiation and improving the output obtained. To accomplish this, a mirror is placed on the far side of the barrier at a distance of approximately one quarter wavelength of the radiation being sensed. Radiation of this wavelength passes through the barrier where it is partly absorbed and travels to the mirror where it is reflected and then back to the barrier where it is again absorbed. By virtue of the fact that the distance from the barrier to the mirror is a quarter wavelength, a standing wave is established whereby the radiation attaches to the mirror at a nodal point and the reflected radiation interacts with the oncoming radiation to produce a maximum electric field or E vector, at the barrier surface. This phenomena was observed by O. Wiener and has been described by Jenkins and White on page 217 and on pages 527–529 of *Fundamentals of Optics*, published in 1957 by McGraw Hill Book Company, Inc. and on pages 175–180 of *Progress in Optics*, Volume I, published 1961 by North-Holland Publishing Co., Amsterdam. See also pages 439–496 of *Encyclopedia of Physics* published in 1956 by Springer-Verlag Gerlin-Gottingen-Heidelberg. I have found that by adjusting the thickness of the layer of platinum silicide so that the combination of impedance of the barrier and the impedance of the space or material between the barrier and the mirror is approximately $120\pi/n$ ohms per square, where n equals the index of refraction of the space or material, the amount of absorption of the radiation can be made substantially total in which case none of the oncoming radiation that passes through the barrier and is reflected escapes being absorbed. While a small percentage of the radiation (approximately 5%) is absorbed on the surface of the reflector, the remaining portion (approximately 95%) is absorbed by the Schottky barrier and thus is available to produce the desired current.

DETAILED DESCRIPTION OF THE PREFERRED EMBODIMENT

Figure 1:
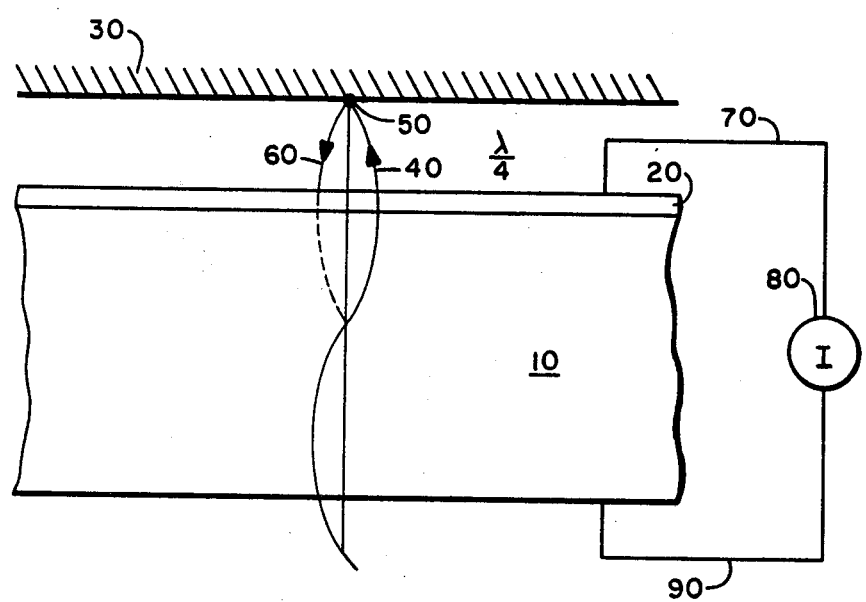
FIG. 1 shows a cross section of a Schottky barrier and mirror positioned so as to produce maximum absorption of oncoming radiation.

In FIG. 1, a base material 10 is shown which is transparent to infrared radiation and may be, for example, silicon. On the upper surface of the base material 10, a layer of material such as platinum, for example, has been vacuum deposited and then heated to cause a Schottky barrier 20 which is approximately 200 angstroms in thickness. By using platinum as the deposited material, the barrier will be primarily responsive to infrared radiation in the 3 to 4.6 micron wavelength range but it should be understood that other materials, such as osmium and iridium, may also be used in which case the layer would be responsive to wavelengths of different magnitudes.

In FIG. 1, a mirror 30 has been placed above the barrier 20 a distance shown as $\lambda/4$ which is the optical equivalent to one quarter of the wavelength of the incoming radiation which is shown by arrow 40 in FIG. 1. In practice, a material which may be air, vacuum or a solid material, such as magnesium fluoride or silicon dioxide, is chosen to occupy the space between the barrier and the mirror. Knowing the index of refraction (n) of the chosen material, the desired impedance of the barrier is calculated from the equation $R=120\pi/n$ ohms per square. The diffusion of the barrier is then performed using standard integrated circuit techniques such as vacuum vapor deposition until the desired impedance is obtained. The material, if not gaseous, is then placed over the barrier again using, for example, vapor deposition and the mirror, which may be aluminum is placed, such as by vapor deposition, over the material so that all parts are bonded together to form the detector. By using integrated circuit techniques, the cost of the detector is kept very low. Since the wavelength being detected by the use of platinum silicide is between 3 and 4.6 microns, the optical distance between mirror 30 and barrier 20 will be approximately one micron (corresponding to an intermediate peak absorption of 4 microns). If the space is air or a vacuum, then the physical distance will be approximately 1 micron but if the space is occupied by other materials, the physical distance will be the optic distance (1 micron) divided by the index of refraction of the material.

The radiation represented by arrow 40 passes through the silicon base 10 and through the barrier 20 where it is partly absorbed and then passes to the mirror 30 where it is reflected from the nodal point 50 thereon. The reflected energy travels back to the barrier as represented by arrow 60 back to the surface barrier 20 where, because of the choice in thickness of the barrier and the distance $\lambda/4$, a standing wave is established and the maximum electric field or, E vector, occurs at the barrier for maximum interaction, and the energy is totally absorbed. The exact thickness of the barrier layer 20 is made so that its impedance will produce maximum absorption. As discussed above, for maximum absorption the impedance of the barrier should be $120\pi/n$ ohms per square where n is the index of refraction of the material between the barrier and the mirror. For air or a vacuum, n=1 and the impedance of the barrier is 376.8 ohms per square. Although a small percent of the radiation is absorbed on the mirror surface 30, this is relatively minor (in the neighborhood of 5%) and the remaining portion of the radiation; i.e., about 95% is therefore absorbed by barrier 20 to maximize the absorption and thus maximize the current output obtained from the Schottky diode. The current output is shown passing along a conductor 70 through a load 80 and back to the silicon base by a conductor 90. The load 80 may be utilized to produce a signal for use in an array of such detectors like that shown in the above-referred U.S. Pat. No. 3,902,066.

It should be understood that other materials may be used to form the surface barrier of the Schottky diode in order to provide a structure which is responsive to other wavelengths of radiation in which case the mirror 30 would have to be positioned with respect to the surface 20 in such a way that the distance is equal to $\lambda/4$ for that particular wavelength and the thickness of the barrier would have to be controlled so that its impedance is again $120\pi/n$ ohms per square. An example would be iridium which, when used as the material, produces a system sensitive to radiation and wavelengths in the order of from 3 to 6 microns, the distance to the mirror would then be 1.4 microns for air or a vacuum so that the wavelength for peak absorption is 5.6 microns. Again, the barrier thickness would be made so as to produce $120\pi/n$ ohms per square.

It is seen that I have produced a greatly enhanced radiation detector utilizing a Schottky barrier and causing maximum absoption of the radiation and thus maximum sensitivity for the detector. It should be understood that I do not wish to be limited to the specific disclosures used in connection with the preferred embodiment but wish only to be limited by the following claims.

The embodiments of the invention in which an exclusive property or right is claimed are defined as follows:

1. In a Schottky barrier radiation detector the improvement comprising:
    a mirror positioned a distance from the barrier substantially equal to one quarter of the wavelength of the radiation being detected.

2. Apparatus according to claim 1 wherein the barrier has a thickness chosen such that the impedance of the barrier is $120\pi/n$ ohms per square where n is the index of refraction of the material between the barrier and the mirror.

3. The method of constructing a radiation detector comprising the steps of:
    1. selecting a first material with a known index of refraction n,
    2. depositing a second material on a radiation transparent base to form a Schottky barrier,
    3. adjusting the thickness of the barrier to produce an impedance determined by the expression $120\pi/n$ ohms per square,
    4. placing a thickness of the first material over the barrier, the thickness being determined as optically equal to $\lambda/4$ where $\lambda$ is the wavelength of the radiation to be detected and,
    5. placing a mirror on the first material at the optical distance $\lambda/4$ so that radiation passing through the base, the barrier and the first material is reflected back to the barrier.

4. The method of claim 3 wherein the placing of the first material on the barrier and the placing of the mirror on the first material is done by vacuum deposition.

* * * * *